United States Patent [19]

Fitzgerald

[11] Patent Number: 4,864,197
[45] Date of Patent: Sep. 5, 1989

[54] HORIZONTAL DEFLECTION CIRCUIT FOR VIDEO DISPLAY MONITOR

[75] Inventor: John J. Fitzgerald, Leominster, Mass.

[73] Assignee: Digital Equipment Corp., Maynard, Mass.

[21] Appl. No.: 50,148

[22] Filed: May 14, 1987

[51] Int. Cl.$^4$ .................................... H01J 29/70
[52] U.S. Cl. ................................ 315/408; 315/365; 315/393; 340/739
[58] Field of Search ............... 315/408, 365, 391, 392, 315/393, 394; 340/739

[56] References Cited

U.S. PATENT DOCUMENTS

| | | | |
|---|---|---|---|
| 4,314,184 | 2/1982 | Ryan | 315/408 |
| 4,464,612 | 8/1984 | Teuling | 315/408 |
| 4,513,228 | 4/1985 | Teuling | 315/408 |
| 4,556,825 | 12/1985 | Thomas | 315/408 |
| 4,625,155 | 11/1986 | Dietz | 315/408 |
| 4,677,352 | 6/1987 | Sibovits et al. | 315/408 |

OTHER PUBLICATIONS

*Modern Dictionary of Electronics*, Graf, 1972, pp. 85, 86.

*Primary Examiner*—Thomas H. Tarcza
*Assistant Examiner*—David Cain
*Attorney, Agent, or Firm*—Nutter, McClennen & Fish

[57] ABSTRACT

A horizontal deflection circuit for controlling the horizontal deflection of an electron beam in a cathode ray tube used, for example, in a video display. The circuit uses a plurality of MOSFET transistors, which are switched on and off in unison for switching between a scan mode and a retrace mode, the MOSFET transistors being cascaded to accommodate the high voltage levels which are developed during retrace. A retrace capacitor and retrace diode are connected between the source and drain terminals of each MOSFET transistor to ensure that the voltages are divided among the transistors so that the entire voltage does not appear across any single one if they do not all switch at precisely the same time.

5 Claims, 1 Drawing Sheet

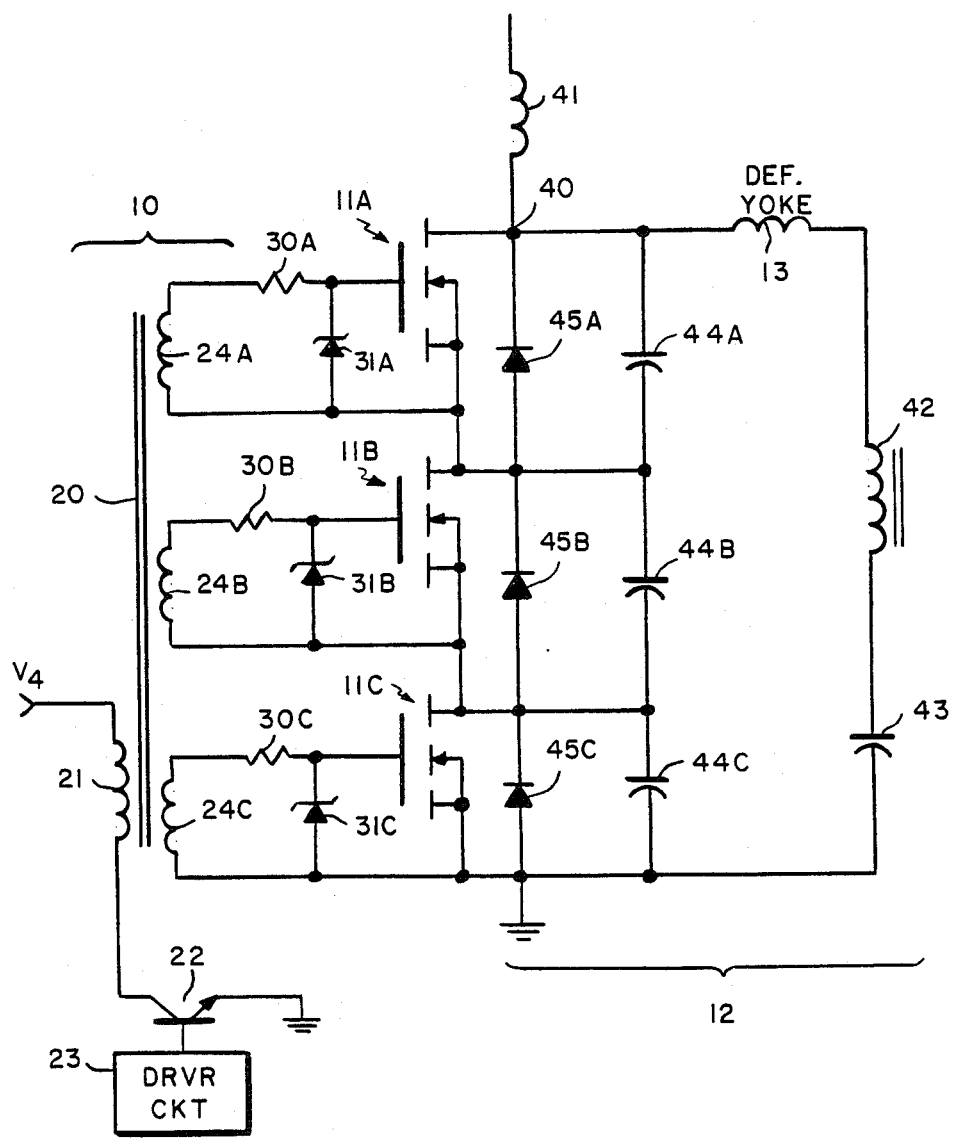

HORIZONTAL DEFLECTION CIRCUIT FOR VIDEO DISPLAY MONITOR

BACKGROUND OF THE INVENTION

1. Field of the Invention

The invention relates generally to the field of electronic circuits, and more specifically to a new and improved ramp generator circuit which is particularly useful as a circuit for controlling electron-beam deflection in a cathode ray tube for a video display monitor.

2. Background

Video display devices include a cathode ray tube for displaying information in the form of visual images on a generally planar screen. In a cathode ray tube, an electron beam is directed from an electron gun toward the screen. Where the beam impinges on the screen, a phosphor coating on the screen fluoresces, resulting in the generation of light at that point which can be observed by a user. The electron gun is pointed generally towards the center of the screen, but the beam is moved horizontally and vertically to permit the beam to scan the surface of the screen by means of magnetic fields generated in coils adjacent the tube between the gun and the screen. As the beam scans, the amplitude of the beam can be varied to result in the generation of light and dark patterns over the face of the screen. The patterns may be, for example, in the shape of alphanumeric characters, that is, text, or graphic images, or some combination of both, depending on the type of information to be displayed.

Two general paradigms are implemented in controlling scanning of the electron beam to generate images in visual display devices. In one, which is commonly implemented in computer video displays and television sets, the electron beam is scanned over the screen in a raster pattern, that is, the beam is directed in a series of horizontal lines across the screen from the top of the screen to the bottom. Horizontal deflection, which enables each line to be generated, and vertical deflection, which enables the series of lines to be generated from the top of the screen to the bottom, are controlled by circuits which are designed to generate deflection signals which vary at a predetermined rate for the display device to generate the raster pattern. As the beam is scanned over the screen, its amplitude is varied to generate the visual images; if the amplitude does not vary, the entire screen will have the same brightness.

In the other paradigm, which is typically used in oscilloscopes, the electron beam scans across the screen, not in a series of lines, but instead in a single line enabled by a horizontal deflection circuit. Typically, vertical deflection is caused by a signal which is input to the oscilloscope by a user. In that case, the user may analyze the input signal as a function of time, which is the time required for the electron beam to scan across the screen. In addition, in a typical oscilloscope, instead of using the oscilloscope's horizontal deflection circuit, the user may input another signal to cause the horizontal deflection. This permits the user to analyze the input signals in relation to each other.

A typical horizontal deflection circuit essentially implements a resonant circuit which has, at different times, two resonant frequencies. The circuit includes a deflection coil which generates a magnetic field that, in turn, controls the deflection of the electron beam. Essentially, when a bipolar transistor is switched from an on condition to an off condition, the resonant circuit operates at a high frequency during which the current through the coil changes relatively quickly, resulting in a relatively fast retrace of the beam from the right edge of the screen to the left edge. During retrace, a very high flyback voltage is developed across the transistor.

When the beam has fully retraced to the left edge of the screen, the resonant circuit changes to a low resonant frequency. When that occurs, the current through the coil changes relatively slowly, resulting in a relatively slow scan of the beam from the left edge of the screen to the right edge. During the scan, the bipolar transistor turns back on again and essentially saturates as relatively large currents flow therethrough.

While bipolar transistors can withstand the high flyback voltages that are developed during retrace, they also have a high minority carrier storage in the collector-base region during saturation. This tends to limit the speed with which the transistor may be switched off, which, in turn, serves to limit the frequency at which the deflection circuit may operate to deflect the electron beam. As a result, while these deflection circuits are satisfactory for normal broadcast television and small, low-resolution video monitors used in computers, they are not satisfactory for use in high resolution monitors or monitors with relatively large screen images.

More recently, a deflection circuit has been developed in which a plurality of parallel-connected metal-oxide semiconductor field effect transistors (MOSFETs) have been substituted for the bipolar transistor. See, for example, K. Ando, A Flicker-Free 2448×2048 Dots Color CRT Display, SID 85 Digest, pages 456 through 460. While a MOSFET generally has almost no carrier storage, and thus could be used in a higher-frequency deflection circuits used in high resolution video monitors, normal MOSFETs are typically unable to withstand the high flyback voltages that are developed in such circuits. Thus, the circuit described in the Ando article requires the use of a specially-developed high voltage MOSFET. In addition, the connection of the MOSFETs in parallel tends to increase their effective total capacitance, which also limits the deflection frequency at which the circuit can operate.

SUMMARY OF THE INVENTION

The invention provides a new and improved horizontal deflection circuit which can operate at high frequencies and which can include typical, off-the-shelf components, particularly MOSFETs.

In brief summary, the new horizontal deflection circuit includes a plurality of series connected, or cascaded, MOSFET control transistors which are turned on and off in unison to control current in a deflection coil. Across each transistor is a retrace capacitor and a retrace diode to effectively divide the voltages which are generated when the MOSFET control transistors are turned off.

During retrace, very large flyback voltages are developed across the MOSFET control transistors and the retrace capacitors and retrace diodes distribute the voltage across the control transistors. This serves to reduce the voltages which are developed across each transistor by a factor corresponding to the number of MOSFET control transistors. In a horizontal deflection circuit which generates typical voltages, currently available off-the-shelf MOSFETs can be used as the control transistors. Further, since the capacitances of the cascaded MOSFET control transistors are in series, the net effective capacitance of the transistors is reduced by a factor corresponding to the number of transistors. Thus, the plural control transistors can switch more rapidly than can a single transistor, and so the circuit can accommodate higher frequency deflection rates.

BRIEF DESCRIPTION OF THE DRAWINGS

This invention is pointed out with particularity in the appended claims. The above and further advantages of this invention may be better understood by referring to the following description taken in conjunction with the accompanying drawing which depicts a horizontal deflection circuit constructed in accordance with the invention.

DETAILED DESCRIPTION OF AN ILLUSTRATIVE EMBODIMENT

The Figure depicts a new horizontal deflection circuit constructed in accordance with the invention. With reference to the Figure, the circuit includes a control section 10 which controls in parallel a plurality of MOSFET control transistors 11A through 11C. The MOSFET control transistors 11A through 11C, in turn, in unison control a deflection signal generating circuit 12 including a deflection coil 13 which generates a magnetic deflection field for controlling the horizontal deflection of an electron beam in a video display tube (not shown).

The control section 10 includes a transformer 20 whose primary winding 21 is connected to a power source indicated by $V_A$, and is controlled by a bipolar transistor 22. The bipolar transistor is, in turn, controlled by a driver circuit 23 to operate as a switch. To initiate a retrace operation, the driver circuit 23 enables tee bipolar transistor 22 to switch from an on condition to an off condition during which time current is not permitted to flow through it. The retrace operation is timed to occur after the electron beam has scanned all the way to a selected position on the right side of the screen. During the retrace time the beam is returned rapidly to the left side of the screen.

After the retrace operation the electron beam begins a scan operation from the left side of the screen toward the right side. During the scan operation, the driver circuit switches the bipolar transistor 22 from the off condition to the on condition. When the scan operation is completed, that is, when the electron beam again reaches the right edge of the screen, the driver circuit again turns the transistor 22 off, which, in turn, initiates another retrace operation.

Transformer 20 has three secondary windings 24A through 24C, each of which connects to and controls the gate of a MOSFET control transistor 11A through 11C through a resistor 30A through 30C. Zener diodes 31A through 31C are connected between the gate and source terminals of the respective MOSFET control transistor 11A through 11C. The transistors 11A through 11C are cascaded, that is, they are connected generally in series with the source terminal of transistor 11A being connected to the drain terminal of transistor 11B and the source terminal of transistor 11B being connected to the drain terminal of transistor 11C. The drain terminal of transistor 11A is connected to a node 40 in the deflection signal generating circuit 12 and the source terminal of transistor 11C is connected to ground.

Node 40 is connected through a coil 41 to a power source $V_B$. As is conventional, the coil 41 may comprise a series coil or one winding of a transformer which is used to generate a high voltage for use elsewhere in the video display. One end of the deflection coil 13 is also connected to node 40. A linearizing coil 42 and a shaping capacitor 43 are connected in series between the other end of the deflection coil 13 and ground. The linearizing coil 42 has an inductance which varies with the direction and level of electric current which passes therethrough. The maximum inductance of linearizing coil 42 is about one order of magnitude less (that is, lower by a factor of ten) than the inductance of the deflection coil 13.

Also connected between node 40 and ground are a set of retrace capacitors 44A through 44C and retrace diodes 45A through 45C, with the retrace diodes 45A through 45C being polled to direct current toward the node 40. One retrace capacitor 44A through 44C and one retrace diode 45A through 45C is connected, in parallel, between the source and drain terminals of a corresponding MOSFET transistor 11A through 11C. Thus, for example, capacitor 44A and diode 45A are connected in parallel between the source and drain terminals of transistor 11A, with the diode being polled to conduct current from the source terminal and toward the drain terminal and node 40. The capacitance of each of the retrace capacitors 44A through 44C is selected to be substantially lower than the capacitance of the shaping capacitor 43; in one embodiment, the capacitance of each retrace capacitor is lower than the capacitance of the shaping capacitor 43 by about two orders of magnitude (that is, a factor of one hundred).

It will be appreciated by those skilled in the art that the deflection signal generating circuit 12, in combination with the MOSFET control transistors 11A through 11C generally forms an inductive-capacitive oscillating circuit. The oscillating circuit comprises deflection coil 13, linearizing coil 42, shaping capacitor 43 and retrace capacitors 44A through 44C, all of which are connected in series. When the MOSFET control transistors 11A through 11C are off, which is generally during retrace time, the retrace capacitors 43 44A through 44C and shaping capacitor are effectively connected in series. The effective capacitance of the series-connected retrace capacitors 44A through 44C and shaping capacitor 43 is relatively small, and so when the MOSFET control transistors 11A through 11C are off, the oscillating circuit is a relatively high-frequency resonant circuit.

However, during scan time, a low-impedance bypass exists around retrace capacitors 44A through 44C. The low-impedance by-pass is provided by the retrace diodes before the MOSFET transistors 11A through 11C are turned on, and by the MOSFET control transistors 11A through 11C after they are turned on, and so the only effective elements in the oscillating circuit at this time include deflection coil 13, linearizing coil 42 and shaping capacitor 43. In this condition, the relatively high capacitance provided by the shaping capacitor 43 results in a low frequency oscillating circuit.

When the deflection circuit depicted in the Figure starts operation, the MOSFET control transistors 11A through 11C are initially on. The retrace capacitors 44A through 44C and shaping capacitors 43 are uncharged, and the deflection yoke 13 and linearizing capacitor 42 have no current flowing therethrough. In that condition, current from the $V_b$ power supply flows through the coil 41 to node 40 and through the MOSFET control transistors 11A through 11C. The on MOSFET control transistors 11A through 11C essentially connects node 40 to a ground voltage level which is present at the source terminal of transistor 11C. The current flow through coil 41 to node 40 increases at a linear rate that is proportional to the voltage applied by the $V_B$ power supply and inversely proportional to the inductance of the coil 41. The current flow through coil 41 generates a magnetic field around the coil 41.

When the control section 10 turns the transistors 11A through 11C off, the current through the coil 41 starts to drop. This causes the magnetic field around coil 41 to begin to collapse, which in turn causes current to flow into retrace capacitors 44A through 44C, charging the retrace capacitors. The collapsing magnetic field causes the voltage level of node 40 to increase to a large level.

After the retrace capacitors 44A through 44C have been charged, they begin to discharge through coil 41 and deflection yoke 13. Since the effective inductance of the series connected deflection yoke 13 and linearizing coil 42 is much lower than the inductance of the coil 41, most of the current flows through the deflection yoke 13 and linearizing coil 43. At this point the effective circuit including the deflection yoke 13, comprises the retrace capacitors 44A through 44C, deflection yoke 13, linearizing coil 42 and shaping capacitor 43. Since the effective capacitance of the retrace capacitors 44A through 44C and shaping capacitors is low, approximating one-third of the capacitance of a retrace capacitor, the effective frequency of this circuit is high. In addition, it will be appreciated that the current through the deflection yoke 13 and linearizing coil 42 generates magnetic fields around them, and the current through the shaping capacitor 43 begins to charge the capacitor.

Some time after the MOSFET control transistors turn off (completion of retrace), the retrace capacitors 44A through 44C have substantially discharged, and the magnetic fields around deflection yoke 13 and linearizing coil 42 reach their peak negative values. At this point, the voltage level of the node 40 reaches the ground level, or, actually, just below ground. Accordingly, the current begins flowing to node 40 through the retrace diodes 45A through 45C as the fields in the deflection yoke and linearizing coil start to decrease. The effective circuit then comprises the deflection yoke 13, linearizing coil 42, shaping capacitor 43 and retrace diodes 45A through 45C, which, because of the relatively high capacitance of shaping capacitor 43, is a relatively low frequency circuit.

Contemporaneously, the current through coil 41 begins to reverse after the voltage level of node 40 falls below that of the $V_B$ power supply. The current from coil 41 begins flowing from the $V_B$ power supply through coil 41 to node 40, reestablishing the magnetic field in the coil 41.

Around the time the current begins flowing into node 40 from the $V_B$ power supply, the driver circuit 23 enables the MOSFET control transistors 11A through 11C to turn on, providing a low impedance path between node 40 and ground around the retrace capacitors 44A through 44C and retrace diodes 45A through 45C. This facilitates the continued generation of the magnetic field around coil 41. As previously, the rate of increase in current is proportional to the voltage provided by the $V_B$ power supply and inversely proportional to the inductance of the coil 41.

Sometime later, after the magnetic fields around the deflection yoke 13 and linearizing coil 42 have collapsed, the shaping capacitor begins to discharge into node 40 through the linearizing coil 42 and deflection yoke 13. This forces current through the linearizing coil 42 and deflection yoke 13, generating magnetic fields therearound, although in the opposite direction from before. Since at this point the effective circuit including the deflection yoke 13 comprises the deflection yoke 13, linearizing coil 42, shaping capacitor 43 and the MOSFET control transistors 11A through 11C, the effective circuit is a low frequency circuit. Accordingly, the rate of change of the current through the deflection yoke 13 increases at a relatively slow rate.

Sometime later, about the time the current through the deflection yoke toward node 40 reaches a selected high level, the driver circuit 23 again enables the control section 10 to turn off MOSFET control transistors 11A through 11C. The magnetic fields around the coil 41, deflection yoke 13 and linearizing coil 42 again collapse to discharge current into the retrace capacitors 44A through 44C. At this point, the effective circuit including deflection yoke 13, which generates the magnetic field for deflecting the electron beam in the video monitor, includes the deflection yoke 13, linearizing coil 42, shaping capacitor 43 and retrace capacitors 44A through 44C, resulting in a high-frequency circuit. Thus, the magnetic field around deflection yoke 13 discharges rapidly into the retrace capacitors 44A through 44C.

Since there are now two sources of current, namely, coil 41 and deflection yoke 13, more current is forced into the retrace capacitors at this point than previously, and so the voltage level of node 40 increases to a larger level than before. The operation of the circuit is essentially the same as previously, except that, since the voltage level at node 40 is higher, the current discharged from the retrace capacitors 44A through 44C through deflection yoke 13 is also greater, resulting in a greater charge on capacitor 43.

It will be appreciated that as the circuit continues to operate, the voltages at node 40 and across the shaping capacitor 43, and the levels of currents through the deflection yoke will increase until they reach steady state values in which most of the current discharging into retrace capacitors 44A through 44C is from the deflection yoke and less current is applied through coil 41. At this point, the voltage across the shaping capacitor is approximately the same as applied to coil 41 by the $V_B$ power supply, with some small variation as currents through the deflection yoke 13 and linearizing coil 42 vary in magnitude and direction. During steady state operation, the shaping capacitor 43 thus operates as a source of voltage similar to that provided by the $V_B$ power source, with the $V_B$ power source compensating for resistive and other losses in the circuit. In the embodiment in which the inductance of the coil 41 is approximately one order of magnitude (a factor of ten) greater than the inductance of the deflection yoke 13, the voltage level across shaping capacitor 43 quickly reaches the voltage provided by the $V_B$ power supply, resulting in steady state operation of the circuit.

After the circuit reaches steady state operation, the electron beam deflection as a function of current through the deflection yoke 13 is as follows. Immediately before MOSFET control transistors 11A through 11C are initially turned off by the control section 10, the current through the deflection yoke 13 is toward node 40. In this condition, the electron beam is being deflected toward the right of center on the screen of the video monitor, preferably to the right edge of the screen.

When the MOSFET control transistors 11A through 11C are turned off, as described above, since the effective circuit including the deflection yoke 13 is a high frequency circuit, the magnetic field around the deflection yoke 13 rapidly collapses, discharging current into node 40, and thus into the retrace capacitors 44A through 44C. The rapid collapse of the magnetic field around the deflection yoke causes the electron beam to quickly return to the center of the screen.

After the retrace capacitors 44A through 44C become fully charged and begin to discharge, the current through the deflection yoke 13 increases in the opposite direction as before, at substantially the same rate since the circuit including the deflection yoke is still a high frequency circuit. Since with current flow in this direction the electron beam is to the left of center of the screen, the beam rapidly progresses to the left edge of the screen as the current increases rapidly in this direction. The current in that direction through the deflection yoke generates the magnetic field in the required direction to enable the deflection to occur. The rapid movement of the electron beam from the right edge of the screen to the left provides the retrace.

Thereafter, after the retrace capacitors 44A through 44C have largely discharged and the retrace diodes 45A through 45C effectively bypass them, the circuit is a low frequency circuit. As described above, the current through the deflection yoke 13 in the direction away from node 40 begins to decrease, this time at a slow rate because of the low effective frequency. The electron beam thus begins a slow scan from the left edge of the screen toward the center as the magnetic field around the deflection yoke 13 collapses with the decrease in current.

Finally, when, as described above, the current through the deflection yoke reverses direction and proceeds toward node 40, the electron beam begins its scan from the center of the screen toward the right. This scan also is at a slow rate, since the effective circuit is a low frequency circuit. The scan of the electron beam proceeds across the screen to the right until the current through the deflection yoke 13 reaches its maximum value, then the MOSFET control transistors 11A through 11C are then again turned off by control section 10 to initiate a retrace operation. Preferably, the control section 10 turns the MOSFET control transistors 11A through 11C off before the current through the deflection yoke begins to decrease to ensure that the return of the electron beam to the left of the screen is as rapid as possible.

The linearizing coil 42 has an inductance which varies with the direction and level of the current passing therethrough. The linearizing coil 42 is selected to have a very low inductance when current is flowing toward node 40, and thus it has little effect on the operation of the circuit toward the end of the scan time and the beginning of the retrace time. However, the linearizing coil has an effect on the operation of the circuit when current flows away from node 40 through deflection coil 13, and specifically has its maximum inductance at the end of the retrace time and the beginning of the scan time. In the absence of the linearizing coil 42, an undesirable non-symmetrical scan current would occur as a result of the turning on and off of the MOSFET control transistors 11A through 11C and effective removal and replacement of the retrace capacitors 44A through 44C, which is corrected by the linearizing coil 42.

Since the circuit depicted in the Figure is essentially an oscillator, very high voltages and currents are developed across the respective components, particularly the flyback voltage developed between node 40 and ground when the MOSFET control transistors 11A through 11C are turned off to isolate node 40 from ground. It will be appreciated that by connecting retrace capacitors 44A through 44C and the retrace diodes 45A through 45C in series and across the drain and source terminals of the associated MOSFET transistors 11A through 11C, the high voltage that is developed at node 40 is equally divided among the three transistors 11A through 11C. This prevents the entire voltage at node 40 from developing across individual transistors 11A through 11C if the three transistors do not turn on or off at precisely the same time at the beginning and end of the retrace period.

As noted above, the control section 10 switches transistors 11A through 11C off at the beginning of the retrace period. It will be appreciated that the switching must be rapid to ensure maximum current flow into the retrace capacitors 44A through 44C. The control section 10 turns off the transistors 11A through 11C by enabling current flow out of the gates of the transistors, which reduces the charge levels of the respective gates. At the same time, the rapidly-increasing voltage at node 40 will be attempting to inject current into the gates of the transistors through the drain-to-gate capacitance present in the transistors, which serves to increase the charge on the gates, tending to keep the transistors 11A through 11C on. Accordingly, to minimize the turnoff time, the control section 10 should remove current at a rate sufficient to accommodate the injected current. This can, however, result in the development of high gate to source voltages, which are limited by the zener diodes 31A through 31C to prevent destruction of the transistors 11A through 11C.

While the horizontal deflection circuit has been described as having three cascaded MOSFET transistors 11A through 11C, depending on the voltages developed at node 40 and the voltages which the respective transistors may be able to withstand, more or fewer transistors may be cascaded in the circuit, along with an associated retrace diode and retrace capacitor for each. However, since each MOSFET transistor has a finite, although low, resistance, it will be appreciated that the number of cascaded transistors directly effects the series resistance between node 40 and ground when the transistors are on. The resistance of this current path may be compensated by adjusting the capacitance of the shaping capacitor 43 and inductance of the linearizing coil 42. That is, for example, a larger resistance in the path from node 40 through the cascaded MOSFET transistors can be compensated by increasing the capacitance of the shaping capacitor 43. However, when the transistors are off, during the left scan period, the capacitance of the shaping capacitor 43 will be too large, which can be compensated by increasing the inductance of the linearizing coil 42. The specific values of the capacitances, resistances and inductances of the specific circuit elements will depend on the times required for deflection in both directions (that is, the time required for deflection of the beam from left to right across the screen and the time required for the retrace operation) and the voltages and currents which are developed.

Finally, it will also be appreciated that the use of MOSFETs as switching transistor 11A through 11C permits the horizontal deflection circuit depicted in the Figure to achieve rapid deflection. Since the charge storage and capacitance of the MOSFETs are generally lower than that of bipolar transistors, the MOSFETs can switch on and off more rapidly than can bipolar transistors to facilitate the rapid switching between scanning and retrace. In addition, cascading the MOSFETs permits the use of current off-the-shelf MOSFETS, and allows them to together withstand the high-voltages generated in the deflection circuit.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. A deflection circuit for generating a magnetic deflection signal for controlling the deflection of an electron beam in a cathode ray tube, said deflection circuit comprising:
    A. timing means for generating a control timing signal having selected conditions to identify a scan time and a retrace time;
    B. switching means including a plurality of MOSFET transistor all controlled in parallel by said control timing signal to be in an on condition during the scan time and off during the retrace time;
    C. deflection means connected to said switching means across said MOSFET transistors for generating said magnetic deflection signal to enable the deflection of the electron beam in one direction during the scan time and in the opposite direction during the retrace time; and
    D. wherein said timing means includes transformer means having a primary winding and a plurality of secondary windings, the number of secondary windings corresponding to the number of MOSFET transistors in the switching means,
        i. the primary winding being connected to a voltage source and to a switch which enables the voltage source to energize the primary winding during the scan time and to de-energize the primary winding during the retrace time, and
        ii. each secondary winding being connected to a gate of one of a the MOSFET transistors to thereby control the MOSFET transistor to be in the on condition during the scan time and in the off condition during the retrace time.

2. A deflection circuit as defined in claim 1 wherein further comprising resistor means connected between each secondary winding and the gate terminal of the associated MOSFET transistor, and voltage limitation means connected to each gate terminal to limit the voltage level of said gate terminal.

3. A deflection circuit as defined in claim 2 further including a plurality of zener diodes, a different one of said zener diodes connected between the gate and source of each of the MOSFET transistors.

4. A deflection circuit as defined in claim 1 wherein said deflection means includes:
    A. power coil means comprising an energizable coil connected to a power supply for supplying current to a node, said switch means being connected to control said node;
    B. deflection coil means connected to said node for generating, in response to the amount and direction of current flow therethrough a magnetic field for controlling the deflection of said electron beam;
    C. deflection control means for controlling the rate of current flow through said deflection coil means to thereby control the amount of deflection of said electron beam; and
    D. retrace means comprising a plurality of retrace capacitors and retrace diodes each connected in parallel between source and drain terminal of one of said MOSFET transistors for controlling retrace while the associated MOSFET transistors are in the off condition.

5. A deflection circuit for generating a magnetic deflection signal for controlling the deflection of an electron beam in a cathode ray tube, said deflection circuit comprising:
    A. timing means for generating a control timing signal having selected conditions to identify a scan time and a retrace time;
    B. switching means including a plurality of MOSFET transistors all controlled in parallel by said control timing signal to be in an on condition during the scan time and off during the retrace time;
    C. deflection means connected to said switching means across said MOSFET transistors for generating said magnetic deflection signal to enable the deflection of the electron beam in one direction during the scan time and in the opposite direction during the retrace time;
    D. wherein said timing means includes transformer means having a primary winding and a plurality of secondary windings, the number of secondary windings corresponding to the number of MOSFET transistors in the switching means; and
    E. wherein said deflection means includes
        i. power coil means comprising an energizable coil connected to a power supply for supplying current to a node, said switch means being connected to control said node;
        ii. deflection coil means connected to said node for generating, in response to the amount and direction of current flow therethrough a magnetic field for controlling the deflection of said electron beam;
        iii. deflection control means for controlling the rate of current flow through said deflection coil means to thereby control the amount of deflection of said electron beam; and
        iv. retrace means comprising a plurality of retrace capacitors and retrace diodes each connected in parallel between source and drain terminal of one of said MOSFET transistors for controlling retrace while the associated MOSFET transistors are in the off condition.

* * * * *